United States Patent
Seong

(10) Patent No.: US 7,852,684 B2
(45) Date of Patent: Dec. 14, 2010

(54) PAGE BUFFER CIRCUIT OF MEMORY DEVICE AND PROGRAM METHOD

(75) Inventor: Jin-Yong Seong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 63 days.

(21) Appl. No.: 12/419,955

(22) Filed: Apr. 7, 2009

(65) Prior Publication Data

US 2009/0207669 A1 Aug. 20, 2009

Related U.S. Application Data

(62) Division of application No. 11/617,331, filed on Dec. 28, 2006, now Pat. No. 7,515,484.

(30) Foreign Application Priority Data

Sep. 29, 2006 (KR) .................... 10-2006-0096185

(51) Int. Cl.
*G11C 7/10* (2006.01)

(52) U.S. Cl. .................... 365/189.05; 365/189.011; 365/189.14; 365/189.17; 365/189.08; 365/189.11

(58) Field of Classification Search ............ 365/189.05, 365/189.011, 189.14, 189.17, 189.08, 189.11
See application file for complete search history.

(56) References Cited

U.S. PATENT DOCUMENTS

| 5,724,284 | A | 3/1998 | Bill et al. |
|---|---|---|---|
| 5,930,172 | A | 7/1999 | Kucera |
| 6,091,631 | A | 7/2000 | Kucera et al. |
| 7,254,064 | B2 | 8/2007 | Kim et al. |
| 7,298,648 | B2 | 11/2007 | Lee et al. |
| 7,301,825 | B2 | 11/2007 | Seong et al. |
| 7,313,020 | B2 | 12/2007 | Chae et al. |
| 7,336,538 | B2 | 2/2008 | Crippa et al. |
| 7,359,248 | B2 | 4/2008 | Chen et al. |

(Continued)

FOREIGN PATENT DOCUMENTS

KR 10-2005-0007653 A 1/2005

(Continued)

*Primary Examiner*—Viet Q Nguyen
(74) *Attorney, Agent, or Firm*—Townsend and Townsend and Crew LLP

(57) ABSTRACT

A page buffer circuit of a memory device including a plurality of Multi-Level Cells (MLCs) connected to at least a pair of bit lines includes a Most Significant Bit (MSB) latch, a Least Significant Bit (LSB) latch, a data I/O circuit, an inverted output circuit, a MSB verification circuit, and a LSB verification circuit. The MSB latch is configured to sense a voltage of a sensing node in response to a control signal and store an upper sensing data, and output an inverted upper sensing data, or store an input data and output an inverted input data. The LSB latch is configured to sense a voltage of the sensing node in response to the control signal, and store and output a lower sensing data, or store and output an input data received through the MSB latch. The data I/O circuit is connected to the MSB latch and a data I/O line, and is configured to perform the input and output of a sensing data or the input and output of a program data.

3 Claims, 3 Drawing Sheets

U.S. PATENT DOCUMENTS

| | | | |
|---|---|---|---|
| 7,366,014 B2 * | 4/2008 | Micheloni et al. | 365/185.03 |
| 7,391,651 B2 | 6/2008 | Chen | |
| 7,515,484 B2 * | 4/2009 | Seong | 365/189.05 |
| 7,594,157 B2 | 9/2009 | Choi et al. | |
| 7,609,548 B2 * | 10/2009 | Park | 365/185.03 |
| 7,668,023 B2 * | 2/2010 | Seong | 365/189.05 |
| 2006/0198188 A1 | 9/2006 | Ju | |
| 2007/0035995 A1 | 2/2007 | Crippa et al. | |
| 2008/0080237 A1 | 4/2008 | Park | |
| 2009/0196111 A1 | 8/2009 | Seong | |
| 2009/0207669 A1 | 8/2009 | Seong | |

FOREIGN PATENT DOCUMENTS

KR    10-2007-0008899 A    1/2007

* cited by examiner

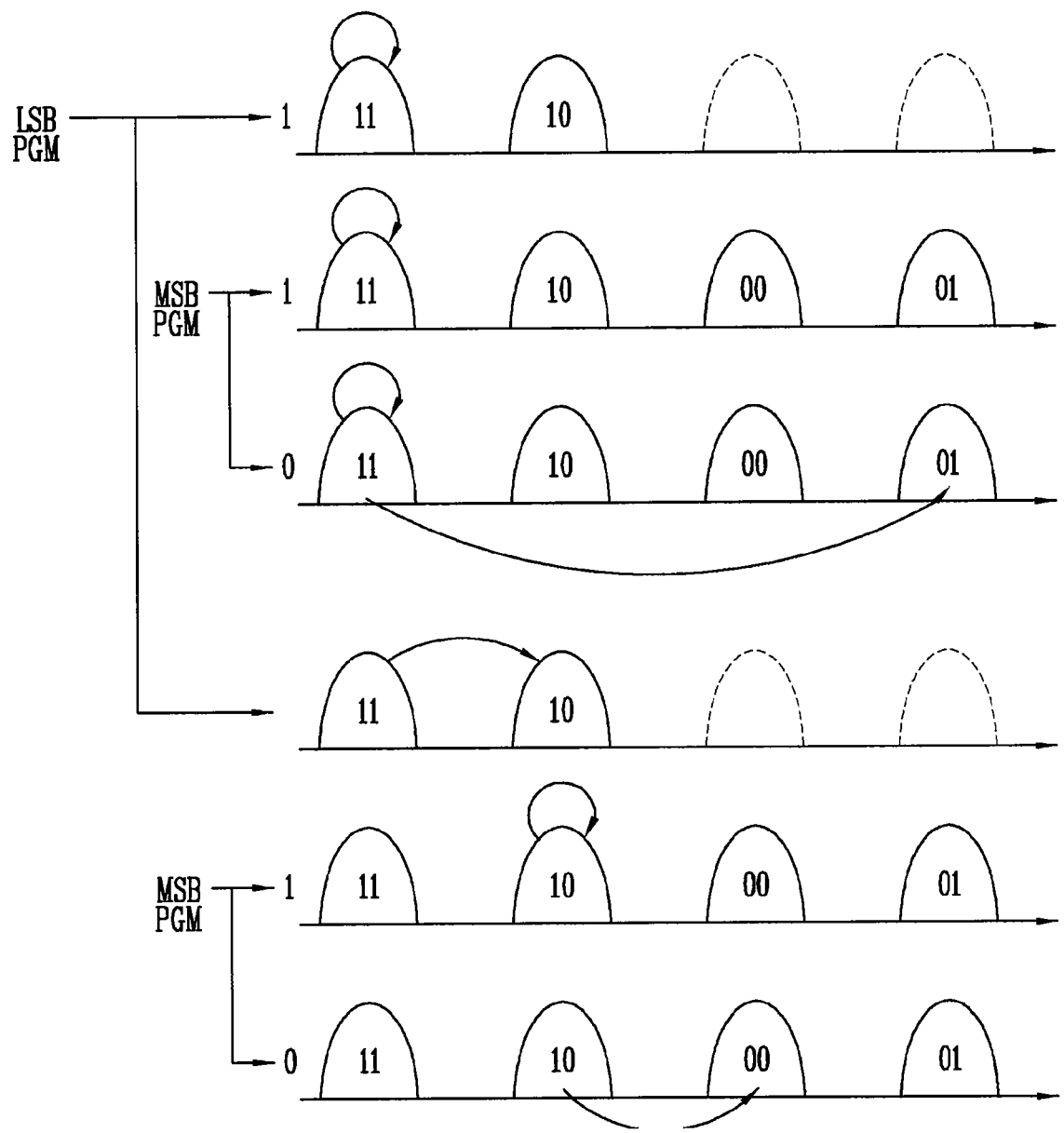

PAGE BUFFER CIRCUIT OF MEMORY DEVICE AND PROGRAM METHOD

CROSS-REFERENCES TO RELATED APPLICATIONS

The present application claims priority to Korean patent application number 10-2006-96185, filed on Sep. 29, 2006, and is a divisional of U.S. patent application Ser. No. 11/617,331, filed on Dec. 28, 2006 now U.S. Pat. No. 7,515,484, which are incorporated by reference in their entirety.

BACKGROUND OF THE INVENTION

The present invention relates to a page buffer for a memory device and, more particularly, to a page buffer circuit of a Multi-Level Cell (MLC) memory device and a programming method.

Flash memory is generally classified into NAND flash memory and NOR flash memory. The NOR flash memory has a structure in which memory cells are respectively connected to a bit line and a word line, and therefore has good random access time characteristics. The NAND flash memory includes a plurality of memory cells connected in series and requires only one contact per cell string, and therefore has good characteristics for integration. Accordingly, the NAND structure is generally used for highly-integrated flash memory.

The well-known NAND flash memory device includes a memory cell array, a row decoder, and a page buffer. The memory cell array includes a plurality of word lines extending in rows, a plurality of bit lines extending in columns, and a plurality of cell strings respectively corresponding to the bit lines.

On one side of the memory cell array are disposed a string select line, the word lines, and the row decoder connected to a common source line. On the other side of the memory cell array is disposed the page buffer connected to the plurality of bit lines.

Recently, in order to further increase the level of integration of such flash memory, active research has been done into a multi-bit cell capable of storing a plurality of data in one memory cell. This type of a memory cell is called a MLC. A memory cell of a single bit is called a Single Level Cell (SLC).

The MLC generally has four or more threshold voltage distributions, and four or more data storage states corresponding to the threshold voltage distributions. A MLC into which 2-bit data can be programmed has four data storage states; [11], [10], [00] and [01]. The four data storage states correspond to threshold voltage distributions of each MLC.

For example, assuming that threshold voltage distributions of a memory cell are −2.7 V or less, 0.3 to 0.7 V, 1.3 to 1.7 V, and 2.3 to 2.7 V, [11] corresponds to −2.7 V or less, [10] corresponds to 0.3 to 0.7 V, [00] corresponds to 1.3 to 1.7 V, and [01] corresponds to 2.3 to 2.7 V. That is, if the threshold voltage of the MLC corresponds to one of the four types of the threshold voltage distributions, 2-bit data information corresponding to any one of [11], [10], [00] and [01] is stored in the MLC.

A MLC page buffer for a program and read operation of a flash memory device is described below.

FIG. 1 is a circuit diagram of a page buffer of a conventional MLC memory device.

Referring to FIG. 1, the MLC memory device includes a bit line selection unit 10 and a page buffer 20. The bit line selection unit 10 is for selecting a bit line according to an input address. This drawing is a simplified view in order to describe the page buffer 20 of the MLC memory device.

As illustrated in FIG. 1, the page buffer 20 includes a Most Significant Bit (MSB) latch unit 21 for programming the MSB of a 2-bit data, and a Least Significant Bit (LSB) latch unit 22 for programming the LSB of a 2-bit data.

The page buffer 20 of the memory device is included in each of a pair of even and odd bit lines, and has a number corresponding to a half of the bit lines of the memory device.

The bit line selection unit 10 includes first to fourth NMOS transistors N1 to N4.

The MSB latch unit 21 includes fifth to thirteenth NMOS transistors N5 to N13, first to third inverters IN1 to IN3, and a second PMOS transistor P2. The second and third inverters IN2 and IN3 constitute a first latch R1.

The LSB latch unit 22 includes fourteenth to twentieth NMOS transistors N14 to N20, fourth to sixth inverters IN4 to IN6, and a third PMOS transistor P3. The fifth and sixth inverters IN5 and IN6 constitute a second latch R2.

The page buffer 20 further includes a first PMOS transistor P1 for providing a precharge voltage for a program or read operation of the page buffer 20, a twenty-first NMOS transistor N21 for a read data output, and a seventh inverter IN7.

The construction of the data input is omitted from FIG. 1.

The operation of the page buffer 20 is described below.

In the program operation, a method of programming the LSB and MSB of a 2 bit data is used.

To this end, the first PMOS transistor P1 for supplying the precharge voltage is turned on, and the signal MSBRST set high to turn on the tenth NMOS transistor N10 of the MSB latch unit 21.

As the precharge voltage is applied, the eleventh NMOS transistor N11 is turned on to reset the first latch R1.

The LSB data is latched into the first latch R1 of the MSB latch unit 21.

The data latched in the first latch R1 is transmitted to the second latch R2 of the LSB latch unit 22 via the seventh NMOS transistor N7.

The data latched in the second latch R2 of the LSB latch unit 22 is transmitted to a memory cell connected to a bit line selected by the bit line selection unit 10, and is programmed into the memory cell.

As described above, after the LSB data is programmed, data verification is performed. The LSB data is read by the second latch R2 and stored therein.

Meanwhile, after programming the LSB, the MSB data is latched into the first latch R1 of the MSB latch unit 21.

The MSB data latched in the first latch R1 is compared with the LSB data read from the second latch R2 in order to determine whether programming has to be performed. The MSB data program is performed according to the determination result.

At this time, the fifth, sixth, fourteenth and fifteenth NMOS transistors N5, N6, N14 and N15 are compared the MSB data with the LSB in order to determine program.

Further, when reading data in the memory cell, the LSB latch unit 22 outputs a read data to the outside through the seventeenth NMOS transistor N17. The seventeenth NMOS transistor N17 is driven according to signal LSBPASS.

The MSB latch unit 21 outputs a read data to the outside through the eighth NMOS transistor N8. The eighth NMOS transistor N8 is driven according to signal MSBPASS.

As described above, the page buffer 20 for programming or reading the MLC comprises twenty-four elements, including sixteenth NMOS transistors, six inverters and two PMOS transistors, in which the MSB latch unit 21 and the LSB latch unit 22 are integrated.

The number of page buffers 20 corresponds to half the number of bit lines in the memory device as described above, and is an indispensable element for programming and reading of data.

Therefore, it is evident that if the capacity of a memory device is increased, the number of bit lines increases and the number of page buffers thus increases. Accordingly, in order to increase the level of integration, it is necessary to reduce the number of elements making up the page buffer.

BRIEF SUMMARY OF THE INVENTION

The present invention is directed to a page buffer circuit of a memory device and a program method, in which the level of integration can be increased by reducing the number of elements in a page buffer.

In one embodiment, a page buffer circuit of a memory device including a plurality of MLCs connected to at least a pair of bit lines includes a MSB latch, a LSB latch, a data I/O circuit, an inverted output circuit, a MSB verification circuit, and a LSB verification circuit. The MSB latch senses a voltage of a sensing node in response to a control signal and stores an upper sensing data, and outputs an inverted upper sensing data, or stores an input data and outputs an inverted input data. The LSB latch senses the voltage of the sensing node in response to the control signal, and stores and outputs a lower sensing data, or stores and outputs an input data received through the MSB latch. The data I/O circuit is connected to the MSB latch and a data I/O line, and performs the input and output of a sensing data or a program data. The inverted output circuit inverts data stored in the LSB latch, and outputs an inverted data to the MSB latch. The MSB verification circuit outputs a verification signal in response to the data stored in the MSB latch. The LSB verification circuit outputs a verification signal in response to the data stored in the LSB latch.

In another embodiment, a memory device includes a memory cell array, a plurality of page buffer circuits and a plurality of Y gate circuits. The memory cell array includes a plurality of MLCs respectively connected to a plurality of bit line pairs and a plurality of word lines. The plurality of page buffer circuits includes a plurality of latch circuits disposed corresponding to the plurality of bit line pairs, respectively. Each of the latch circuits outputs data, which will be programmed into one of the MLCs connected to a pair of corresponding bit lines at the time of a program operation. The latch circuits then stores data read from one of the MLCs connected to the pair of bit lines, where only a first latch circuit included in the plurality of latch circuits is connected to the data I/O line. The plurality of Y gate circuits are connected to the plurality of page buffer circuits, respectively, and also the data I/O line. Each of the Y gate circuits outputs the program data, which is received through the data I/O line, to the first latch circuit in response to one of I/O control signals at the time of a program operation. Then outputs the read data, which is received from the first latch circuit, to the data I/O line at the time of a read operation.

In an embodiment of the present invention, there is provided a program operation method for a memory device made up of a plurality of MLCs respectively connected to a plurality of bit line pairs and a plurality of word lines. This method includes the steps of; decoding an address signal in response to a program instruction, selecting the word line and bit line according to the decoding result, and generating a control signal to page buffers connected to the selected bit line; inputting a lower bit program data to a LSB latch unit through a MSB latch unit of a page buffer in response to the generated control signal, and programming the data into a MLC connected to the selected word line and bit line; inputting an upper bit program data to the MSB latch unit of the page buffer; performing a first verification step by transferring the data in the MSB latch unit to a lower program latch unit and allowing the MSB latch unit to read and verify data of the selected MLC; performing a second verification step by transferring the upper bit program data, stored in the LSB latch unit, to the MSB latch unit, and allowing the LSB latch unit to read and verify data of the selected MLC; and programming the upper program data, stored in the MSB latch unit, into the selected MLC according to the first and second verification results.

In still another embodiment of the present invention, the page buffer circuit of a memory device includes a plurality of MLCs connected to at least a pair of bit lines includes a bit line selection unit, upper and lower data transmission circuits, a MSB latch circuit, a data I/O circuit unit, a LSB latch circuit, and an inverted output circuit. The bit line selection unit is configured to select one of the pair of bit lines according to an input address. The upper and lower data transmission circuits are connected to a sensing node, which is connected to the bit line selection unit. The upper and lower data transmission circuits output a program data to the bit line selection unit through the sensing node. The MSB latch circuit is connected to the sensing line and the upper data transmission circuit, and stores and outputs a MSB sensing data or a program data. The data I/O circuit unit is connected to the MSB latch circuit and an external data I/O line. The data I/O circuit unit receives data to be programmed into the MSB latch circuit and outputs the sensing data stored in the MSB latch circuit to an external data I/O line. The LSB latch circuit is connected to the sensing node, and stores a LSB sensing data, or receives a LSB data to be programmed into the MSB latch circuit through the MSB data transmission circuit. The LSB latch circuit outputs the stored LSB data to the sensing node. The inverted output circuit inverts the data stored in the LSB latch, and outputs the inverted data to the MSB latch.

BRIEF DESCRIPTION OF THE DRAWINGS

FIG. 3 is a view illustrating a memory operating method of the MLC memory device.

DESCRIPTION OF SPECIFIC EMBODIMENTS

A specific embodiment of the present patent will be described with reference to the accompanying drawings.

Figure 1:
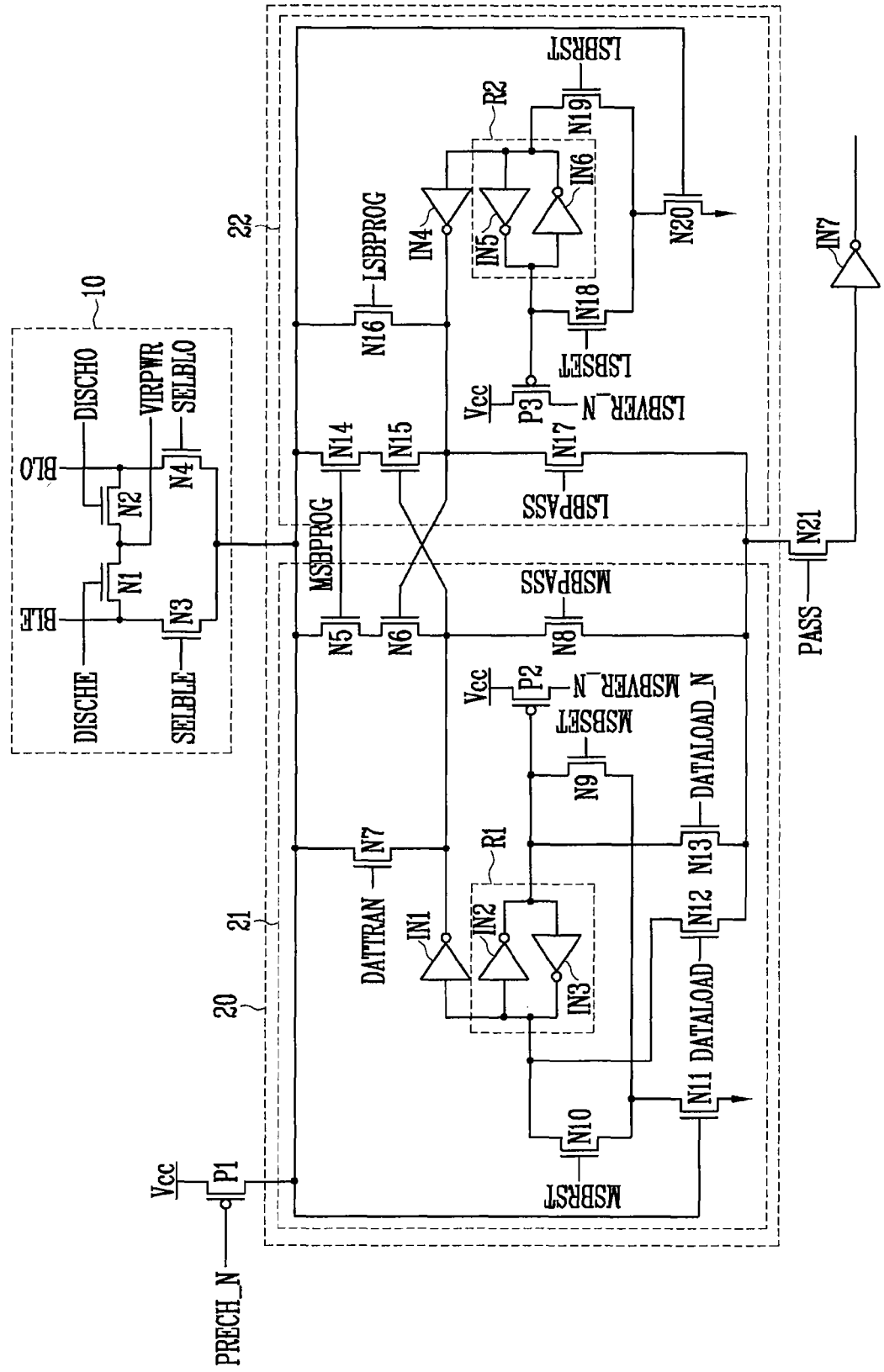
FIG. 1 is a circuit diagram of a page buffer of a conventional MLC memory device.
Figure 2:
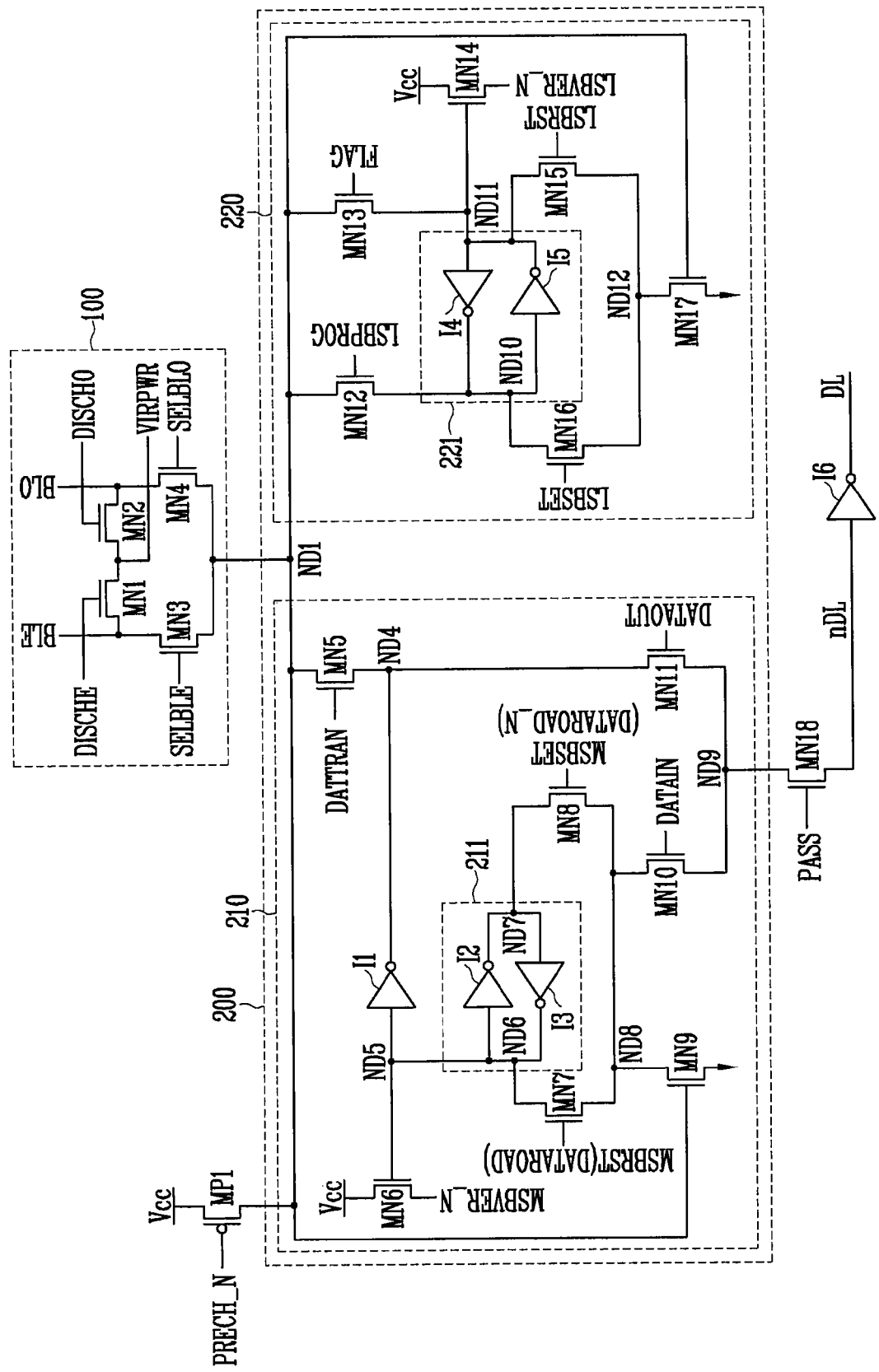
FIG. 2 is a circuit diagram of a page buffer of a MLC memory device according to an embodiment of the present invention.

FIG. 2 is a circuit diagram of a page buffer of a MLC memory device according to an embodiment of the present invention. FIG. 3 is a view illustrating a memory operating method of the MLC memory device.

Referring to FIG. 2, the MLC memory device according to an embodiment of the present invention includes a bit line selection unit 100 for selecting a bit line according to an input address, and a page buffer 200 for programming or reading data into or from a memory cell.

The bit line selection unit 100 includes first to fourth NMOS transistors MN1 to MN4.

The page buffer 200 includes a MSB latch unit 210 for programming the MSB of a 2-bit data, and a LSB latch unit 220 for programming the LSB of a 2-bit data.

The MSB latch unit 210 includes fifth to eleventh NMOS transistors MN5 to MN11, and first to third inverters I1 to I3. The LSB latch unit 220 includes twelfth to seventeenth NMOS transistors MN12 to MN17, and fourth and fifth inverters I4 and I5.

A first PMOS transistor MP1 for providing a precharge voltage is connected to node ND1 of the page buffer 200.

The first PMOS transistor MP1 is driven according to a percharge signal PRECH_N, and precharges the node ND1 with a power supply voltage.

The construction of the MSB latch unit 210 is described below. The fifth NMOS transistor MN5 operates according to a data transmission signal DATTRAN for the purpose of data transmission, and is connected between the node ND1 and a node ND4. The fifth NMOS transistor MN5 transfers data latched in the MSB latch unit 210 to the LSB latch unit 220 or a memory cell connected to the bit line selection unit 100.

The first inverter I1 is connected between the node ND5 and the node ND4. The node ND5 is connected to the gate of the sixth NMOS transistor MN6. The first inverter I1 serves to prevent the node ND5 from being arbitrarily changed due to a data output operation.

The sixth NMOS transistor MN6 outputs the MSB program verification resulting signal MSBVER_N as a power supply voltage. This signal is used outside the shown circuit in FIG. 2 to inform of the MSB program verification result.

The second and third inverters I2 and I3 are connected between the node ND6 and the node ND7, thus forming a first latch 211. The first latch 211 temporarily stores the MSB data for the program or read operation.

Furthermore, the seventh NMOS transistor MN7 is connected between the node ND6 and the node ND8. A MSB reset signal MSBRST or a data load signal DATALOAD is input into the gate of the seventh NMOS transistor MN7, thus setting the first latch 211. Accordingly, a path is created through which an input data is stored in the first latch 211.

The ninth NMOS transistor MN9 is connected between the node ND8 and a ground voltage, and has a gate to which a precharge line of the node ND1 is connected.

The ninth NMOS transistor MN9 provides a path for resetting the first latch 211 to logic 0.

Furthermore, the eighth NMOS transistor MN8 is connected between the node ND7 and the node ND8, and has a gate to which the MSBSET signal or an inverted signal DATALOAD_N of the data load signal for setting MSB is input.

The eleventh NMOS transistor MN11 is connected between the node ND4 and the node ND9, and provides a data output path in accordance with a data output signal DATAOUT.

The tenth NMOS transistor MN10 is connected to the node ND8 and the node ND9, and provides a data input path in accordance with a data input signal DATAIN.

The eighteenth NMOS transistor MN18 provides a path through which data output from the node ND9 is output to the data line DL.

Meanwhile, the construction of the LSB latch unit 220 is described below.

The twelfth NMOS transistor MN12 is connected between the node ND1 and a node ND10, and provides a path through which LSB data latched in the LSB latch unit 220 is programmed into a memory cell. The gate of the twelfth NMOS transistor MN12 is connected to the program signal LSBPROG of a LSB. The thirteenth NMOS transistor MN13 is connected between the node ND1 and a node ND11. The gate of the thirteenth NMOS transistor MN13 is connected to a flag control signal.

The flag is for moving data from the LSB latch unit 220 to the MSB latch unit 210 again. The data from the LSB latch unit 220 is data that has been moved previously from the MSB latch unit 210 to the LSB latch unit 220 during the program operation. Data moved in this manner to the MSB latch unit 210 is an inversion of the data of the LSB latch unit 220.

The fourteenth NMOS transistor MN14 receives the power supply voltage, and outputs a LSB program verification signal LSBVER_N in accordance with the state of the node ND11.

The fourth and fifth inverters I4 and I5 are connected between the node ND10 and the node ND11, and comprise a second latch 221.

The fifteenth NMOS transistor MN15 is connected between the node ND11 and a node ND12, and has a gate to which a reset signal LSBRST of a LSB is input.

The sixteenth NMOS transistor MN16 is connected between the node ND10 and the node ND12, and has a gate to which a setting signal LSBSET of a LSB is input.

Furthermore, the seventeenth NMOS transistor MN17 is connected between the node ND12 and the ground voltage, and has a gate to which the node ND1 is connected.

The page buffer 200 constructed above is comprised of a total of 18 elements, including 13 NMOS transistors and 5 inverters. This number is seven in number smaller than that of the conventional page buffer.

The operation of the page buffer 200 with a reduced number of elements according to an embodiment of the present invention is described below.

The page buffer 200 according to an embodiment of the present invention reads LSB page data and MSB page data from the MSB latch unit 210 and the LSB latch unit 220, respectively, at the time of a read operation, and outputs the read data to an outside circuit through the eleventh NMOS transistor MN11.

In more detail, the MSB latch unit 210 outputs the data of the MSB page through the eleventh NMOS transistor MN11. The LSB latch unit 220 transfers the data of the LSB page to the MSB latch unit 210, and outputs to the outside through the eleventh NMOS transistor MN11.

In order to transfer the data of the LSB latch unit 220 to the MSB latch unit 210, it is required that the signal PRECH_N be input as logic low (L), the first PMOS transistor MP1 be turned on, and the node ND1 be applied with the power supply voltage Vcc and thus becomes logic high (H). At the same time, the eighth NMOS transistor MN8 is turned on by inputting the MSBSET signal as logic high.

The ninth NMOS transistor MN9 is turned on and the eighth NMOS transistor MN8 is turned on, by means of the logic high of the node ND1. Accordingly, the node ND7 goes low, and the node ND5 goes high.

Thereafter, the signal LSBPROG is input as a logic high, and the signal MSBRST is input as a logic high, so that LSB page information of the node N10 is transferred to the node ND5.

The time taken to transfer the data of the LSB latch unit 220 to the MSB latch unit 210 is several μs or less, and therefore rarely has influence on the total data output time.

Furthermore, a data program method of the page buffer 200 according to an embodiment of the present invention is described below.

In order to program a LSB data, the MSB latch unit 210 controls the signal DATAIN and the signal MSBRST or MSBSET, and receives and latches a LSB data.

The LSB data latched in the MSB latch unit 210 is transferred to the LSB latch unit 220 by employing the signals DATTRAN, PRECH_N and LSBSET or LSBRST.

The LSB data transferred to the LSB latch unit 220 is programmed into a memory cell by means of a common LSB data program method.

After the LSB data is programmed, a MSB data is programmed.

Before the MSB data is programmed, the MSB latch unit 210 and the LSB latch unit 220 are set to an initial state. In order to set the MSB latch unit 210 and the LSB latch unit 220 to an initial state, the first PMOS transistor MP1 is turned on by inputting the signal PRECH_N as logic low, thus changing the level of the node ND1 to high. The node ND5 goes low by inputting the signals MSBRST and LSBSET as logic high, thus making the node ND10 logic low.

After the initialization setting, the MSB data is latched into the first latch 211 by employing the signals DATAIN and MSBRST or MSBSET. A MSB flag check is performed using the data latched in the first latch 211.

The MSB flag check is for determining whether the data has to be programmed. The state of the node ND5 is changed according to the data latched in the first latch 211, and the sixth NMOS transistor MN6 is turned on/off according to the state of the node ND5. The signal MSBVER_N, which is output as the sixth NMOS transistor MN6 is turned on or off, is checked to determine the input MSB data and to decide if a program operation is needed.

In more detail, the memory cell has a data value of "11" in an erase state, and performs the data program operation only when the input data is "0". If the input data is "0", the node ND5 goes high and the sixth NMOS transistor MN6 is turned on. The sixth NMOS transistor MN6 is turned on, so that the signal MSBVER_N is output, thus informing that the program operation is required.

Furthermore, the LSB latch unit 220 applies the signal LSBSET so that the LSB data programmed into the memory cell is latched into the second latch unit 221.

Thereafter, the MSB data input to the MSB latch unit 210 is transferred to the LSB latch unit 220. In the LSB, the signal LSBVER_N depending on turn-on/off of the fourteenth NMOS transistor MN14 is checked to determine whether a program operation has to be performed.

Thereafter, the data stored in the memory cell is verified in the MSB latch unit 210. This is for the purpose of stopping further programming by determining the memory cells on which the MSB program may have been performed before the MSB program.

In other words, when a data [00] or [01] is sought to be stored by the MSB program, further programming is stopped when a threshold voltage in which a data of [00] or [01] is distributed only with the LSB data program process is reached.

In order to determine whether there are cells that have reached a threshold voltage in which a data of [00] is distributed, the MSB latch unit 210 reads and verifies data from the bit line by applying the signal MSBRST. The verification result is informed through the signal MSBVER_N (that is, the MSB flag check signal of the sixth NMOS transistor MN6).

The information transmitted from the MSB latch unit 210 to the LSB latch unit 220 is moved to the MSB latch unit 210 again.

The reason why the data of the LSB latch unit 220 is moved to the MSB latch unit 210 is that it corrects data that has been erroneously changed in the memory cell verification process.

In others words, in the case where the data of the node ND5 becomes different from a data for an original MSB program after verification, the data of the LSB latch unit 220 is fetched and is corrected.

After the data of [00] is verified, [01] program is verified. In verifying the [01] program, the LSB latch unit 220 loads data from the memory cell, and verifies the loaded data.

A memory cell for verification sets a bit line, and the LSB latch unit 220 loads a LSB page and performs verification. The verification result is informed by outputting the signal LSBVER_N (that is, the LSB flag check signal) through the fourteenth NMOS transistor MN14.

After [00] and [01] are verified as described above, a MSB program is performed on the memory cell on which the MSB program has to be performed.

The MSB program can be performed by applying the signal DATTRAN through a bit line selected in order to program a MSB data, which has been transferred from the LSB latch unit 220 to the MSB latch unit 210, after verification for the data [00].

The MSB program method of the page buffer 200 according to an embodiment of the present invention is summarized in short as follows.

The MSB latch unit 210 and the LSB latch unit 220 are first reset. Signals that are applied at this time include the signals PRECH_N, MSBRST and LSBSET. The node ND5 and the node ND10 become logic low.

Furthermore, the MSB latch unit 210 receives a MSB data. Signals applied at this time include PASS, DATAIN, MSBSET or MSBRST as illustrated in FIG. 2.

It is determined whether the data latched in the MSB latch unit 210 needs to be programmed by performing the MSB flag check. That is, when the input data is "0", the program operation has to be performed, and when the input data is "1", the program operation does not need to be performed.

After the MSB flag check is finished, the LSB latch unit 220 reads a LSB data of a memory cell connected for the program operation.

Furthermore, after the MSB data stored in the MSB latch unit 210 is moved to the LSB latch unit 220, the MSB latch unit 210 performs verification for the data [00] in the memory cell.

If verification is completed, the data of the LSB latch unit 220 is moved to the MSB latch unit 210 again. The LSB latch unit 220 performs data verification for [01] in the memory cell.

After verification is completed, a bit line is selected with respect to memory cells, which have been determined to require program, and programs the MSB data stored in the MSB latch unit 210 into the memory cells.

In the above method, the process in which the MSB latch unit 210 and the LSB latch unit 220 perform data verification for [00] and [01], respectively, is repeatedly performed while performing the MSB program. If the program operation on a memory cell in which the data of [00] has to be stored is finished, a verification process on [01] may be omitted.

As described above, in accordance with the page buffer circuit of the memory device and the program method according to the present invention, the number of elements comprising a page buffer of a MLC memory device can be reduced. Accordingly, area can be reduced and a program operation can be performed efficiently.

The above embodiments of the present invention are illustrative and various alternatives possible. Other additions, subtractions, or modifications are obvious in view of the present disclosure and are intended to fall within the scope of the appended claims.

What is claimed is:

1. A page buffer circuit of a memory device including a plurality of MLCs connected to at least a pair of bit lines, the page buffer circuit comprising:

a bit line selection unit configured to select one of the pair of bit lines according to an input address;

upper and lower data transmission circuits connected to a sensing node connected to the bit line selection unit, and configured to output a program data to the bit line selection unit through the sensing node;

a MSB latch circuit connected to the sensing line and the upper data transmission circuit, and configured to store and output a MSB sensing data or a program data;

a data I/O circuit unit connected to the MSB latch circuit and further an external data I/O line, and configured to receive data to be programmed into the MSB latch circuit and output the sensing data, stored in the MSB latch circuit, to an external data I/O line;

a LSB latch circuit connected to the sensing node, and configured to store a LSB sensing data, or receive a LSB data to be programmed into the MSB latch circuit through the MSB data transmission circuit and store the received LSB data, and output the LSB data to the sensing node; and an inverted output circuit configured to invert the data stored in the LSB latch, and output the inverted data to the MSB latch.

2. The page buffer circuit of claim 1, wherein the LSB latch circuit transfers the sensed data to the MSB latch circuit through the sensing node so that the data is output to the outside.

3. The page buffer circuit of claim 1, wherein the MSB latch circuit and the LSB latch circuit are connected to verification circuits for outputting verification data according to data stored therein.

* * * * *